(12) United States Patent
Kusunoki et al.

(10) Patent No.: US 10,344,131 B2
(45) Date of Patent: Jul. 9, 2019

(54) METHOD OF MANUFACTURING CONDENSATION-CURABLE SILICONE RESIN COMPOSITION SHEET, AND METHOD OF MANUFACTURING LIGHT-EMITTING APPARATUS

(71) Applicant: SHIN-ETSU CHEMICAL CO., LTD., Tokyo (JP)

(72) Inventors: Takayuki Kusunoki, Annaka (JP); Yuusuke Takamizawa, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 16/210,126

(22) Filed: Dec. 5, 2018

(65) Prior Publication Data

US 2019/0106549 A1  Apr. 11, 2019

Related U.S. Application Data

(62) Division of application No. 15/812,615, filed on Nov. 14, 2017, now Pat. No. 10,179,845.

(30) Foreign Application Priority Data

Dec. 5, 2016 (JP) .................... 2016-236150

(51) Int. Cl.
| | | |
|---|---|---|
| *H01L 21/00* | (2006.01) | |
| *C08J 5/18* | (2006.01) | |
| *C08L 83/06* | (2006.01) | |
| *H01L 33/50* | (2010.01) | |
| *H01L 33/56* | (2010.01) | |
| *C08L 83/04* | (2006.01) | |
| *C09D 183/04* | (2006.01) | |
| *C08G 77/16* | (2006.01) | |
| *C08G 77/18* | (2006.01) | |
| *C08G 77/12* | (2006.01) | |
| *C08G 77/14* | (2006.01) | |

(52) U.S. Cl.
CPC ............... *C08J 5/18* (2013.01); *C08L 83/04* (2013.01); *C08L 83/06* (2013.01); *C09D 183/04* (2013.01); *H01L 33/502* (2013.01); *H01L 33/56* (2013.01); *C08G 77/12* (2013.01); *C08G 77/14* (2013.01); *C08G 77/16* (2013.01); *C08G 77/18* (2013.01); *C08L 2203/206* (2013.01); *C08L 2205/025* (2013.01); *H01L 2933/005* (2013.01); *H01L 2933/0041* (2013.01)

(58) Field of Classification Search
CPC .. C08J 5/18; C08L 83/04; C08L 83/06; C09D 183/04; H01L 33/502; H01L 33/56
See application file for complete search history.

(56) References Cited

U.S. PATENT DOCUMENTS

| | | | |
|---|---|---|---|
| 7,250,467 B2 | 7/2007 | Hatanaka et al. | |
| 10,179,845 B2* | 1/2019 | Kusunoki | ................... C08J 5/18 |
| 2008/0308828 A1 | 12/2008 | Kashiwagi et al. | |
| 2009/0042043 A1 | 2/2009 | Joseph et al. | |
| 2013/0168717 A1 | 7/2013 | Kono et al. | |
| 2014/0374787 A1 | 12/2014 | Kono et al. | |
| 2016/0160047 A1 | 6/2016 | Kusunoki et al. | |
| 2017/0114220 A1 | 4/2017 | Kusunoki et al. | |

FOREIGN PATENT DOCUMENTS

| | | |
|---|---|---|
| EP | 0 686 670 A1 | 12/1995 |
| EP | 2 610 932 A1 | 7/2013 |
| EP | 3 031 845 A1 | 6/2016 |
| EP | 3 159 373 A1 | 4/2017 |
| JP | 2004-339482 A | 12/2004 |
| JP | 2005-524737 A | 8/2005 |
| JP | 4927019 B2 | 2/2017 |

OTHER PUBLICATIONS

Mar. 21, 2018 Extended Search Report issued in European Patent Application No. 17001894.9.
U.S. Appl. No. 15/812,615, filed Nov. 14, 2017, in the name of Kusunoki et al.

* cited by examiner

*Primary Examiner* — Richard A Booth
(74) *Attorney, Agent, or Firm* — Oliff PLC

(57) ABSTRACT

The present invention provides methods of manufacturing a condensation-curable silicone resin composition sheet that is in a plastic solid state or a semi-solid state at ordinary temperature, including: (A) organopolysiloxane having a weight average molecular weight of 5,000 or more and 1,000,000 or less in terms of polystyrene shown by the following formula (1):

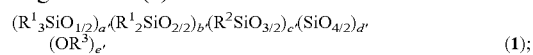

(1);

together with (B) organopolysiloxane having a molecular weight of 10,000 or more and 1,000,000 or less in terms of polystyrene shown by the following formula (2):

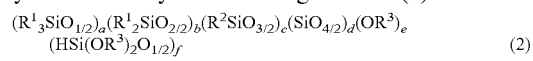

(2)

in an amount of 5 to 100 parts by mass based on 100 parts by mass of the component (A). This condensation-curable silicone resin composition sheet is easy to be handled and has high heat resistance and ultraviolet light resistance while being excel in curing characteristics.

10 Claims, No Drawings

METHOD OF MANUFACTURING CONDENSATION-CURABLE SILICONE RESIN COMPOSITION SHEET, AND METHOD OF MANUFACTURING LIGHT-EMITTING APPARATUS

This a Divisional of application Ser. No. 15/812,615 filed Nov. 14, 2017, and claims the benefit of Japanese Application No. 2016-236150 filed Dec. 5, 2016. The entire disclosures of the prior applications are hereby incorporated by reference herein their entireties.

TECHNICAL FIELD

The present invention relates to a condensation-curable silicone resin composition sheet that is in a solid state or a semi-solid state at room temperature in an uncured state (i.e., without heat treatment) and can be laminated and adhered onto the surface of an LED device chip to enable to convert blue light and ultraviolet light of the LED, and a method of manufacturing the same, as well as a method of manufacturing a light-emitting apparatus by using the condensation-curable silicone resin composition sheet.

BACKGROUND ART

The use of a fluorescent substance to convert the wavelength is widely known in the field of a light-emitting diode (LED) (Patent Literature 1). On the other hand, silicone resins have attracted attention as a material for covering an LED device for encapsulation and protection since it shows excellent light-resistance (Patent Literature 2).

In a white LED, fluorescent substances are generally dispersed in the vicinity of a chip to convert a blue light into a pseudo white light by a method of covering an LED chip with a silicone resin or an epoxy resin in which a fluorescent substances are dispersed and so on.

The fluorescent substances, however, have to be dispersed uniformly in the covering resin layer to make uniform white light since color drift is liable to occur when the fluorescent substances are dispersed ununiformly or unevenly in the resin layer. Accordingly, various methods have been investigated including screen printing and a method in which fluorescent substances are dispersed by sedimentation. These methods, however, have problems of complicating the manufacturing process and failing to obtain sufficient stability. Accordingly, it has been demanded for a convenient technology that can disperse fluorescent substances uniformly on the surface of a chip.

In LEDs and so on, the resin layer to cover the LED device is required to have high heat resistance and ultraviolet light resistance. Due to recent shifting to shorter wavelength and higher power of LEDs, addition curable silicone resins as in Patent Literature 3 have become insufficient in heat resistance and ultraviolet light resistance. This is because the addition curable silicone resin gives a cured silicone resin that contains a silmethylene bond (Si—CH$_2$—CH$_2$—Si) in the main chain skeleton. In shorter wavelength UV-LED, degradation of this silmethylene bond is accelerated particularly. This causes a problem markedly in a transparent encapsulating layer for transmitting UV light without using a fluorescent substance. To solve the foregoing problem, a condensation curable silicone resin has been proposed in which the main chain skeleton only contains siloxane bonds (Si—O—Si). With the lower reactivity, however, the condensation curable polyorganosiloxane is inferior to the addition curable polyorganosiloxane in productivity. The use of large amount of condensation catalyst to improve the reactivity accelerates the degradation of silicone resin, thereby failing to exhibit high heat resistance and light resistance that are intrinsic to silicon resins. Many of the catalysts are inappropriate for the fields in which transparency is important because the catalyst itself is colored or assumes a color by degradation.

CITATION LIST

Patent Literature

PATENT LITERATURE 1: Japanese Unexamined Patent Application Publication 2005-524737
PATENT LITERATURE 2: Japanese Patent Application Laid-Open Publication No. 2004-339482
PATENT LITERATURE 3: Japanese Patent No. 4927019

SUMMARY OF INVENTION

Technical Problem

The present invention was accomplished in view of the above-described circumstances. It is an object of the present invention to provide a condensation-curable silicone resin composition sheet that is easy to be handled and has high heat resistance and ultraviolet light resistance while being excel in curing characteristics.

Solution To Problem

To solve the foregoing problem, the present invention provides a condensation-curable silicone resin composition sheet, comprising:

(A) organopolysiloxane having a weight average molecular weight of 5,000 or more and 1,000,000 or less in terms of polystyrene and being in a plastic solid state or a semi-solid state at ordinary temperature, with the molecule having at least two silicon atom-bonded alkoxy groups or silicon atom-bonded hydroxy groups, shown by the following formula (1):

$$(R^1{}_3SiO_{1/2})_a(R^1{}_2SiO_{2/2})_b(R^2SiO_{3/2})_c(SiO_{4/2})_{d'} (OR^3)_{e'} \quad (1)$$

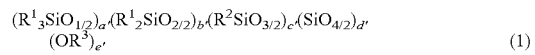

wherein each $R^1$ independently represents a hydrogen atom, a monovalent aliphatic hydrocarbon group having 1 to 6 carbon atoms, or an aromatic hydrocarbon group having 6 to 12 carbon atoms; $R^2$ represents a monovalent aliphatic hydrocarbon group having 1 to 6 carbon atoms or an aromatic hydrocarbon group having 6 to 12 carbon atoms; $R^3$ represents a hydrogen atom, an alkyl group having 1 to 6 carbon atoms, or an alkoxyalkyl group having 2 to 6 carbon atoms; each of "a'", "b'", "c'", and "d'" is an integer of 0 or more; "e'" is an integer of 2 or more; and b'+c'+d' is an integer of 1 or more; and (B) organopolysiloxane having a molecular weight of 10,000 or more and 1,000,000 or less in terms of polystyrene, with the molecule having at least two silicon atoms, each of which has one hydrogen atom and two alkoxy groups or hydroxy groups, shown by the following formula (2)

$$(R^1{}_3SiO_{1/2})_a(R^1{}_2SiO_{2/2})_b(R^2SiO_{3/2})_c(SiO_{4/2})_d(OR^3)_e (HSi(OR^3)_2O_{1/2})_f \quad (2)$$

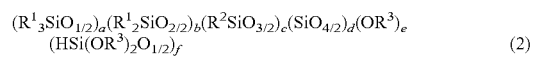

wherein, $R^1$, $R^2$ and $R^3$ have the same meanings ascribed above, each of "a", "b", "c", "d", and "e" is an integer of 0 or more; c+d is an integer of 2 or more; and "f" is an integer of 2 or more;

wherein the condensation-curable silicone resin composition sheet is in a plastic solid state or a semi-solid state at ordinary temperature and comprises the component (B) in an amount of 5 to 100 parts by mass based on 100 parts by mass of the component (A).

Such a condensation-curable silicone resin composition sheet can be a condensation-curable silicone resin composition sheet that is easy to be handled since it is in a solid state or a semi-solid state at room temperature in an uncured state, and it can give a cured material promptly to provide a cured material that exhibits high heat resistance and light resistance such as ultraviolet light resistance, It is preferable that the condensation-curable silicone resin composition sheet further comprise a fluorescent substance as a component (C).

The inventive condensation-curable silicone resin composition sheet can be used as a wavelength conversion sheet by containing a fluorescent substance. The condensation-curable silicone resin composition sheet is in a solid state or a semi-solid state at ordinary temperature, which allows the fluorescent substance to have stable dispersion state over time.

It is preferable that the content of the component (C) be 0.1 to 1,000 parts by mass with respect to 100 parts by mass of a sum total of the component (A) and the component (B).

When the content of the component (C) is in such a range, the condensation-curable silicone resin composition sheet becomes more suitable as a wavelength conversion sheet.

It is preferable that the component (C) have an average particle diameter of 1 to 50 μm.

As described above, the fluorescent substance of component (C) preferably has an average particle diameter of 1 to 50 μm.

The present invention also provides a method of manufacturing the condensation-curable silicone resin composition sheet described above, comprising:

diluting an organopolysiloxane composition to constitute the condensation-curable silicone resin composition sheet with an organic solvent, applying the organopolysiloxane composition diluted with the organic solvent onto a substrate sheet to form a coated film, and drying the formed coated film at 25 to 180° C. to manufacture the condensation-curable silicone resin composition sheet.

The inventive condensation-curable silicone resin composition sheet can be manufactured by such a manufacturing method.

The present invention further provides a method of manufacturing a light-emitting apparatus having a covered LED device, comprising:

disposing the foregoing condensation-curable silicone resin composition sheet on the surface of an LED device, curing the condensation-curable silicone resin composition sheet by heating to form a silicone resin layer, and covering the surface of the LED device with the formed silicone resin layer, Such a method of manufacturing a light-emitting apparatus can cover the surface of LED device with a layer containing a fluorescent substance to perform photoconversion stably.

Advantageous Effects of Invention

The inventive condensation-curable silicone resin composition sheet has favorable curing characteristics and handling properties, that is workability, and can easily form a cured material layer which is transparent or loaded with a fluorescent substance to cover an LED device. Thus formed cured material layer excels at heat resistance, light resistance such as ultraviolet light resistance, optical transparency, toughness, and adhesion properties that are intrinsic to silicone resins. Accordingly, it is particularly suitable for encapsulating an LED device.

DESCRIPTION OF EMBODIMENTS

As described above, it has been demanded for a condensation-curable silicone resin composition sheet that is easy to be handled, can give a cured material promptly, and can give a cured material exhibiting high heat resistance and light resistance.

The present inventors have diligently investigated to solve the foregoing problems and consequently found that it is possible to obtain a condensation-curable silicone resin composition sheet that can be cured promptly in condensation curing without containing a catalyst to give a cured material that exhibits high heat resistance and light resistance from a condensation-curable silicone resin composition sheet that is in a solid state or a semi-solid state at ordinary temperature as a composition, comprising organopolysiloxane that is in a solid state or a semi-solid state at ordinary temperature in which at least two silicon atom-bonded alkoxy groups or silicon atom-bonded hydroxy groups are contained in the molecule, together with organopolysiloxane that gives immediate curing characteristics having two or more silicon atoms in the molecule in which each of the silicon atoms has one or more hydrogen atom(s) and two or more alkoxy groups or hydroxy groups, each of which is bonded to the same silicon atom; thereby brought the present invention to completion.

Hereinafter, the present invention will be specifically described, but the present invention is not limited thereto.

Incidentally, in the present description, the ordinal temperature means 24±2° C. (i.e., 22 to 26° C.), and the weight average molecular weight in terms of polystyrene is measured by gel-permeation chromatography (GPC) under the following conditions.

In this description, Me represents a methyl group, Et represents an ethyl group, and Ph represents a phenyl group.

[GPC Measurement Conditions]
Eluent: tetrahydrofuran (THF)
Flow rate: 0.6 mL/min
Column: TSK Guard column Super H-L
TSK gel Super H4000 (6.0 mm I.D.×15 cm×1)
TSK gel Super H3000 (6.0 mm I.D.×15 cm×1)
TSK gel Super H2000 (6.0 mm I.D.×15 cm×2)
(each of them produced by Tosoh Corporation)
Column temperature: 40° C.
Sample injection amount: 20 μL (a THF solution in a sample concentration of 0.5 wt %)
Detector: Differential refractive index detector (RI)

<Condensation-Curable Silicone Resin Composition Sheet>

The inventive condensation-curable silicone resin composition sheet is in a plastic, solid state or a semi-solid state at ordinary temperature and comprises the component (A) and component (B) described below.

[Component (A)]

The component (A) in the present invention is organopolysiloxane having a weight average molecular weight of 5,000 or more and 1,000,000 or less in terms of polystyrene and being in a plastic solid state or a semi-solid state at ordinary temperature, with the molecule having at least two silicon atom-bonded alkoxy groups or silicon atom-bonded hydroxy groups, shown by the following formula (1):

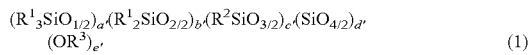
(1)

wherein each $R^1$ independently represents a hydrogen, atom, a monovalent aliphatic hydrocarbon group having 1 to 6 carbon atoms, or an aromatic hydrocarbon group having 6 to 12 carbon atoms; $R^2$ represents a monovalent aliphatic hydrocarbon group having 1 to 6 carbon atoms or an aromatic hydrocarbon group having 6 to 12 carbon atoms; $R^3$ represents a hydrogen atom, an alkyl group having 1 to 6 carbon atoms, or an alkoxyalkyl group having 2 to 6 carbon atoms; each of "a'", "b'", "c'", and "d'" is an integer of 0 or more; "e'" is an integer of 2 or more; and b'+c'+d' is an integer of 1 or more. This component (A) is added in order to control the curing characteristics and the properties.

The preferable ranges of the foregoing "a'", "b'", "c'", "d'", and "e'" are such that "a'" is an integer of 0 to 5,000, more preferably an integer of 0 to 2,500; "b'" is an integer of 10 to 12,000, more preferably an integer of 100 to 10,000; "c'" is an integer of 0 to 10,000, more preferably an integer of 0 to 8,000; "d'" is an integer of 0 to 10,000, more preferably an integer of 0 to 8,000; "e'" is an integer of 2 to 500, more preferably an integer of 2 to 250; satisfying 20≤c'+d'≤20,000, more preferably 50≤c'+d'≤15,000; and 15≤b'+c'+d'≤1,500, more preferably 20≤b'+c'+d'≤1,000.

When the component (A) is organopolysiloxane in a solid state or a semi-solid state within the foregoing preferable ranges, it is possible to form a sheet that is easy to be handled and excels in mechanical properties.

The organopolysiloxane of the component (A) in the present invention has a molecular weight of 5,000 or more and 1,000,000 or less in terms of polystyrene. The component (A) is apt to be liquid when the molecular weight is less than 5,000 in terms of polystyrene. The component (A) becomes a gel state when the molecular weight is more than 1,000,000 in terms of polystyrene, thereby being insoluble in solvent and incompatible with other materials.

The organopolysiloxane of component (A) described above can be synthesized by hydrolysis condensation of halogenated silane or alkoxysilane using a known method, but a commercial product may also be used.

[Component (B)]

The component (B) in the present invention is organopolysiloxane having a molecular weight of 10,000 or more and 1,000,000 or less in terms of polystyrene, with the molecule having at least two silicon atoms, each of which has one hydrogen atom and two alkoxy groups or hydroxy groups, shown by the following formula (2): $(R^1{}_3SiO_{1/2})_a$ $(R^1{}_2SiO_{2/2})_b(R^2SiO_{3/2})_c(SiO_{4/2})_d(OR^3)_e(HSi(OR^3)_2O_{1/2})_f$ (2) wherein, $R^1$, $R^2$ and $R^3$ have the same meanings as described above, each of "a", "b", "c", "d", and "e" is an integer of 0 or more; c+d is an integer of 2 or more; and "f" is an integer of 2 or more.

The preferable ranges of the foregoing "a", "b", "c", "d", "e", and "f" are such that "a" is an integer of 0 to 5,000, more preferably an integer of 0 to 2,500; "b" is an integer of 10 to 12,000, more preferably an integer of 100 to 10,000; "c" is an integer of 0 to 10,000, more preferably an integer of 0 to 8,000; "d" is an integer of 0 to 10,000, more preferably an integer of 0 to 8,000; "e" is an integer of 0 to 500, more preferably an integer of 0 to 250; "f" is an integer of 2 to 500, more preferably an integer of 2 to 250; satisfying 20 c+d 20,000, more preferably 50≤c+d≤15,000.

The organopolysiloxane of component (B) in the present invention has a molecular weight of 10,000 or more and 1,000,000 or less in terms of polystyrene. The component (B), the molecular weight of which is less than 10,000 in terms of polystyrene, makes the condensation reaction slow, thereby failing to obtain a cured product promptly. The component (B) becomes a gel state when the molecular weight is more than 1,000,000 in terms of polystyrene, thereby being insoluble in solvent and incompatible with other materials.

When the component (B) is organopolysiloxane in a solid state or a semi-solid state within the foregoing preferable ranges, it is possible to form a sheet that is easy to be handled and excels in mechanical properties.

The foregoing component (B) may be used alone or may be used as a mixture of two or more types.

The polyorganosiloxane of component (B) described above can be synthesized by hydrolysis condensation of halogenated silane or alkoxysilane using a known method, but a commercial product may also be used. Illustrative examples of the synthesis method include a method of condensation reaction of an organosilicon compound, with the molecule having a silicon atoms) that has one hydrogen atom and three of alkoxy groups or hydroxy groups, and an organosilicon compound having a silanol group (s) in the presence of a catalyst such as hydroxide of alkaline earth metal, The component (B) is added in an amount of 5 to 100 parts by mass, preferably 10 to 90 parts by mass, more preferably 20 to 80 parts by mass based on 100 parts by mass of the component (A). In this range, sufficient curing rate can be obtained. The component (B) is still in scope of the present invention even when the component (B) is liquid at ordinary temperature, provided that the formed curable resin composition retains a solid state or a semi-solid state. The component (B) is, however, preferably organopolysiloxane that is in a solid state or a semi-solid state at ordinary temperature.

[Component (C)]

The inventive condensation-curable silicone resin composition sheet may contain a fluorescent substance as a component (C). As the substance of component (C), any known fluorescent substance may be used. The amount to be blended is generally in a range of 0.1 to 1,000 parts by mass, preferably 10 to 500 parts by mass with respect to 100 parts by mass of a sum total of the component (A) and the component (B). The fluorescent substance of component (C) may generally have a particle diameter of 0.01 to 100 μm, preferably 0.1 to 80 μm, more preferably about 0.5 to 50 μm, which are ranges of particle diameter in measurement of particle diameter distribution by laser diffraction method with a CILAS laser measurement apparatus, for example. The average particle diameter is preferably 1 to 50 μm, more preferably 3 to 20 μm. Herein, the average particle diameter means a particle diameter at a mass average value D50 (or a median diameter) in particle size distribution measured with a laser diffraction particle size distribution measuring apparatus.

The fluorescent substance may be any substance that absorbs a light from a semiconductor light-emitting diode with a nitride-based semiconductor as a luminous layer, for example, and converts the wavelength into a different wavelength light. Preferable example thereof includes at least one type selected from the group consisting of a nitride-based fluorescent substance and an oxynitride-based fluorescent substance mainly activated by a lanthanoid element such as Eu and Ce; an alkaline earth halogen apatite fluorescent substance, an alkaline earth metal halogen borate fluorescent substance, an alkaline earth metal aluminate fluorescent substance, an alkaline earth silicate fluorescent substance, an alkaline earth sulfide fluorescent substance, an alkaline earth thiogallate fluorescent substance, an alkaline earth silicon nitride fluorescent substance, a germanate fluorescent substance mainly activated by a lanthanoid element such as Eu and a transition metal element such as Mn; a rare earth aluminate fluorescent substance and a rare earth silicate fluorescent substance mainly activated by a lanthanoid element such as Ce; and an organic and organic complex fluorescent substance, a Ca—Al—Si—O—N-based oxynitride glass fluorescent substance mainly activated by a lanthanoid element such as Eu. Illustrative example thereof includes the following fluorescent substances, but not restricted thereto. In the following explanation of the fluorescent substance, M is at least one element selected from the group consisting of Sr, Ca, Ea, Mg, and Zn; X is at least one element selected from the group consisting of F, Cl, Br, and I; and R is Eu, Mn, or a combination of Eu and Mn.

Illustrative examples of the nitride-based fluorescent substance mainly activated by a lanthanoid element such as Eu and Ce include $M_2Si_5N_8$: Eu, $MSi_7N_{10}$: Eu, $M_{1.8}Si_5O_{0.2}N_8$: Eu, and $M_{0.9}Si_7O_{0.1}N_{10}$: Eu.

Illustrative example of the oxynitride-based fluorescent substance mainly activated by a lanthanoid element such as Eu and Ce includes $MSi_2O_2N_2$: Eu.

Illustrative example of the alkaline earth halogen apatite fluorescent substance mainly activated by a lanthanoid element such as Eu or a transition metal element such as Mn includes $M_5(PO_4)_3X$: R.

Illustrative example of the alkaline earth metal halogen borate fluorescent substance includes $M_2B_5O_9X$: R.

Illustrative examples of the alkaline earth metal aluminate fluorescent substance include $SrAl_2O_4$: R, $Sr_4Al_{14}O_{25}$: R, $CaAl_2O_4$: R, $BaMg_2Al_{16}O_{27}$: R, $BaMg_2Al_{16}O_{12}$: R, and $BaMgAl_{10}O_{17}$: R.

Illustrative examples of the alkaline earth sulfide fluorescent substance include $La_2O_2S$: Eu, $Y_2O_2S$: Eu, and $Gd_2O_2S$: Eu.

Illustrative examples of the rare earth aluminate fluorescent substance mainly activated by a lanthanoid element such as Ce include a YAG-based fluorescent substance represented by a composition formula such as $Y_3Al_5O_{12}$: Ce, $(Y_{0.8}Gd_{0.2})_3Al_5O_{12}$: Ce, $Y_3(Al_{0.8}Ga_{0.2})_5O_{12}$: Ce, and $(Y, Gd)_3(Al, Ga)_5O_{12}$, as well as $Tb_3Al_5O_{12}$: Ce and $Lu_3Al_5O_{12}$: Ce obtained by substituting part or all of Y with Tb, Lu and so on.

Illustrative examples of other fluorescent substances include ZnS: Eu, $Zn_2GeO_4$: Mn, and $MGa_2S_4$: Eu.

The above fluorescent substance can contain, as required, one or more elements selected from the group consisting of Tb, Cu, Ag, Au, Cr, Nd, Dy, Co, Ni, and Ti, instead of or in addition to Eu.

The Ca—Al—Si—O—N—based oxynitride glass fluorescent substance is a fluorescent substance based on an oxynitride glass matrix material that contains $CaCO_3$ in an amount of 20 to 50 mole % expressed as CaO converted therefrom, 0 to 30 mole % of $Al_2O_3$, 25 to 60 mole % of SiO, 5 to 50 mole % of AlN, and 0.1 to 20 mole % of rare earth oxide or transition metal oxide, with the sum of the five components being 100 mole %. In the fluorescent substance with oxynitride glass as a matrix material, the nitrogen content is preferably 15 wt % or less. In addition to the rare earth oxide ions, another rare earth element ion to be a sensitizer is preferably contained as a co-activator in the fluorescent substance glass in a content ranging 0.1 to 10 mole % as rare earth oxide.

Any fluorescent substance other than the above fluorescent substances having similar performance and effects can also be used.

In addition to the components (A) to (C) described above, other optional components can be blended to the condensation-curable silicone resin composition sheet of the present embodiment.

Inorganic Filler

Blend of inorganic filler brings effects such that light scattering of an obtained cured material or fluidity of an obtained composition becomes an appropriate range, and a material using the composition improves the strength. The inorganic filler is not particularly limited, but is preferably particulates, which does not lower the optical properties. Illustrative examples thereof include reinforcing inorganic filler such as fumed silica, fumed titanium dioxide, and fumed alumina; and non-reinforcing inorganic filler such as calcium carbonate, calcium silicate, titanium dioxide, ferric oxide, carbon black, and zinc oxide. These inorganic fillers can be blended, appropriately in a range of 600 parts by mass or less (0 to 600 parts by mass) in total with respect to 100 parts by mass of a sum total of the component (A) and the component (B).

Liquid Silicone

Into the condensation-curable silicone resin composition sheet of the present embodiment, liquid silicon component can be added in accordance with needs as fax as the inventive condensation-curable silicone resin composition sheet retains a solid state or a semi-solid state at ordinary temperature without becoming liquid. Such a liquid silicone component preferably has a viscosity of about 1 to 100,000 mPa.s at 25° C. and includes vinylsiloxane, hydrogensiloxane, alkoxysiloxane, hydroxysiloxane, and mixtures thereof. The amount to be added is determined with the proviso that the condensation-curable silicone resin composition sheet retains a solid state or a semi-solid state at room temperature, which is generally 50% by mass or less with respect to the total amount of the condensation-curable silicone resin composition sheet.

Other Components

The inventive condensation curable silicone resin composition sheet may further contain other component(s) such as a pH adjuster and an antioxidant.

Illustrative examples of the pH adjuster include organic acids such as acetic acid and citric acid, as well as organic bases such as pyridine and N,N-dimethylaniline Illustrative examples of the antioxidant include benzoic acid, isopropylmethylphenol, ethylhexanediol, lysozyme chloride, chlorhexidine hydrochloride, octylphenoxyethanol, and o-phenylphenol.

It is preferable that the inventive condensation-curable silicone resin composition sheet does not contain a condensation catalyst. Such a composition sheet gives a cured material that can achieve high heat resistance and light resistance intrinsic to silicone resins without occurring coloring of the resin due to a catalyst and degradation of a catalyst. However, it is possible that the inventive sheet contains the catalyst with a small amount.

The simplest form of the condensation-curable silicone resin composition sheet of the present embodiment is a composition consisting of the component (A) and the component (B) without containing other components.

The inventive condensation-curable silicone resin composition sheet is composed of a thermosetting resin composition that is in a plastic solid state or a semi-solid state at ordinary temperature in its uncured state. Herein, the wording of "ordinary temperature" means the ambient temperature in an ordinal state, which is generally a temperature in a range of 15 to 35° C., typically 25° C. The wording of "semi-solid" represents a state of material that has plasticity and can be formed into a particular shape to retain the shape for at least 1 hour, preferably 8 hours or more. Accordingly, a fluidal material with very high viscosity at ordinary temperature is in a semi-solid state, for example, when the given shape thereof does not changes in a short period such that the change (i.e., collapsing) cannot be detected with naked eyes in at least 1 hour due to the very high viscosity though it has a fluidity intrinsically.

(Method of Manufacturing Condensation-Curable Silicone Resin Composition Sheet)

The present invention provides a method of manufacturing a condensation-curable silicone resin composition sheet comprising:

diluting an organopolysiloxane composition to constitute the condensation-curable silicone resin composition sheet with an organic solvent, applying the organopolysiloxane composition diluted with the organic solvent onto a substrate sheet to form a coated film, and drying the formed coated film at 25 to 180° C. to manufacture the condensation-curable silicone resin composition sheet.

As described above, the inventive condensation-curable silicone resin composition sheet can be manufactured by using an organopolysiloxane composition, which is obtained by blending the components (A) to (B) or the components (A) to (C) and an optional component(s) contained in some cases by any methods to prepare an organopolysiloxane composition to constitute the condensation-curable silicone resin composition sheet. Specifically, the organopolysiloxane composition can be prepared by uniformly mixing organopolysiloxane of component (A), organopolysiloxane of component (B), a fluorescent substance of component (C), and the optional component(s) described above, for example, generally with a commercial mixer (e.g., planetary mixer). It is also possible to form varnish by dissolving the component (A) and the component (B) in organic solvent, followed by adding the component (C), and mixing them uniformly with a commercial mixer (e.g., "THINKY" CONDITIONING MIXER manufactured by THINKY CORPORATION).

The organic solvent is not particularly limited with the proviso that the solvent can dissolve the component (A) and the component (B). Illustrative example thereof include hydrocarbon-based solvents such as benzene, toluene, and xylene; ether-based solvents such as tetrahydrofuran, 1,4-dioxane, and diethyl ether; ketone-based solvents such as methyl ethyl ketone; halogen-based solvents such as chloroform, methylene chloride, and 1,2-dichloroethane; alcoholic solvents such as methanol, ethanol, isopropyl alcohol, and isobutyl alcohol; together with octamethylcyclotetrasiloxane, hexamethyldisiloxane; and solvents such as cellosolve acetate, cyclohexanone, butyl cellosolve, methylcarbitol, carbitol, buthylcarbitol, diethylcarbitol, cyclohexanol, diglyme, and triglyme. Each of the organic solvents may be used alone or together with two or more types.

The inventive condensation-curable silicone resin composition sheet may be manufactured by forming the organopolysiloxane composition into a sheet form at 40 to 150° C. in a solventless condition with a heat press machine. It also can be manufactured by diluting (dissolving) the organopolysiloxane composition with organic solvent, applying the organopolysiloxane composition in a varnish state diluted with the organic solvent onto a substrate sheet with a film coater to form a coated film, and drying the formed coated film at 25 to 180° C. (preferably heated to 60 to 180° C.) for several minutes to evaporate the solvent, thereby processing the composition to a sheet form. The formed condensation-curable silicone resin composition sheet is preferably preserved in a frozen state, for example, in order not to proceed the curing reaction.

Thus manufactured condensation-curable silicone resin composition sheet of the present invention can be immediately cured by heating when it is needed to form a flexible cured material in a sheet form that has higher hardness without surface tack.

In the inventive condensation-curable silicone resin composition sheet, the curing temperature can be adjusted so as to perform the curing in a desired curing time. The curing temperature is preferably in a range of 40 to 200° C. more preferably 60 to 180° C. The condensation-curable silicone resin composition sheet is preferably cured in a multistage curing at individual curing temperature in order to prevent foaming due to the volatile components.

It is to be noted that the inventive condensation-curable silicone resin composition sheet preferably shows a gelation time of 4 hours or less at 150° C.

(Method of Manufacturing Light-Emitting Apparatus)

The present invention provides a method of manufacturing a light-emitting apparatus having a covered LED device, comprising:

disposing the condensation-curable silicone resin composition sheet described above on the surface of an LED device, curing the condensation-curable silicone resin composition sheet by heating to form a silicone resin layer, and covering the surface of the LED device with the formed silicone resin layer (which is transparent or loaded with a fluorescent substance).

The inventive condensation-curable silicone resin composition sheet is usable for encapsulating an LED device, particularly for encapsulating a blue LED device or an ultraviolet light LED device. It is possible to form a covering film of the cured material on an LED device by disposing (usually, pressing) the inventive condensation-curable silicone resin composition sheet on the LED device, followed by heating to cure the same. In this manner, the Surface of the LED device is covered with a layer-containing a fluorescent substance that performs a photoconversion stably. The obtained layer containing a fluorescent substance excels in flexibility while being hard and has few surface tack.

The condensation-curable silicone resin composition sheet is usually used in a thickness of 1 to 500 µm, preferably 10 to 300 µm, but the thickness is adjusted appropriately in accordance with the contents of fluorescent substance or the light emission efficiency. The size of the condensation-curable silicone resin composition sheet may be adjusted to the size of an LED device to be covered. The condensation-curable silicone resin composition sheet is disposed on the surface of an LED device, and then heated to be cured. The conditions of heat curing is as described above, and secondary curing is usually performed after primary curing.

The pressing can be performed generally at room temperature or more and 300° C. or less under pressure of 10 MPa or less (usually 0.01 to 10 MPa), preferably 5 MPa or less (e.g., 0.1 to 5 MPa), particularly 0.5 to 5 MPa.

Such a method as described above makes it possible to obtain a light-emitting apparatus having a covered LED device.

The inventive condensation-curable silicone resin composition sheet is advantageous industrially since it is in a solid state or a semi-solid state at ordinary temperature and easy to be handled, and it can be cured in a short period even when a condensation catalyst is not used. The inventive condensation-curable silicone resin composition sheet gives a cured material that is excellent in heat resistance, ultraviolet light resistance, and light resistance, thereby being very useful for various uses exposed to severe conditions such as encapsulant for a semiconductor, an LED, and a solar cell.

EXAMPLES

Hereinafter, the present invention will be explained more specifically with the aid of Examples, hut the present invention is not limited these Examples. Incidentally, each weight average molecular weight is a measured value in terms of polystyrene measured by GPC under the foregoing conditions. Each average particle diameter refers a particle diameter at a mass average value D50 (or a median diameter) in particle size distribution measured with a laser diffraction particle size distribution measuring apparatus. The following materials were used as the components (A) to (E).

Component (A):

(A-1): $((CH_3)_2SiO_{1.0})_{b'}(SiO_{2.0})_{d'}(OCH_3)_{d'}(OCH_3)_{e'}$; b'=300, d'=2, e'=6, Mw=23,206

(A-2): $((CH_3)_3SiO_{0.5})_{a'}(SiO_{2.0})_{d'}(OR^3)_{e'}$; a'=448, d'=750, e'=98, $R^3$=H or $CH(CH_3)_2$, Mw=83,523

(A-3): $((CH_3)_2SiO_{1.0})_{b'}(OH)_{e'}$; b'=11,000, e'=2, Mw=820,000

(A-4): $((CH_3)_2SiO_{1.0})_{b'}(CH_3SiO_{1.5})_{c'}(OR^3)_{e'}$; b'=202, c'=810, e'=120, $R^3$=H or $CH_3$, Mw=73,087

(A-5): $((CH_3)_2SiO_{1.0})_{b'}(CH_3SiO_{1.5})_{c'}(OR^3)_{e'}$; b'=2,950, c'=9,100, e'=414, $R^3$=H or $CH(CH_3)_2$, Mw=850,067

(A-6): $(CH_3)_3SiO_{0.5})_{a'}(Me_2SiO_{1.0})_{b'}(MeSiO_{1.5})_{c'}(OR^3)_{e'}$; a'=5, b'=32, c'=105, e'=14, $R^3$=H or $CH(CH_3)_2$, Mw=10,096

(A-7): $((CH_3)_2SiO_{1.0})_{b1'}(CH_3HSiO_{1.0})_{b2'}((C_6H_5)SiO_{1.5})_{c'}(OH)_{e'}$; b1'=21, b2'=1, c'=100, e'=19, Mw=15,045

(A'-1): $((CH_3)_2SiO_{1.0})_{b'}(CH_3SiO_{1.5})_{c'}(OCH_3)_{e'}$; b'=20, c'=2, e'=4, Mw=1,862

Component (B):

(B-1): $((CH_3)_2SiO_{1.0})_{b}(CH_3SiO_{1.5})_{c}(OCH(CH_3)_2)_{e}(HSi(OCH_3)_2O_{0.5})_{f}$; b=2,950, c=9,100, e=310, f=104, Mw=857,026

(B2): $((CH_3)_3SiO_{0.5})_{a}((CH_3)_2SiO_{1.0})_{b}(CH_3SiO_{1.5})_{c}(OCH(CH_3)_2)_{e}$—$(HSi(OCH_2CH_3)_2O_{0.5})_{f}$; a=5, b=29, c=102, e=9, f=5, Mw=10,959

(B-3): $((CH_3)_2SiO_{1.0})_{b}(CH_3SiO_{1.5})_{c}(OCH_2CH_3)_{e}(HSi(OCH_3)_2O_{0.5})_{f}$; b=11,050, c=2,010, e=19, f=20, Mw=956,673

(B-4): $((CH_3)_3SiO_{0.5})_{a}((CH_3)_2SiO_{1.0})_{b}(CH_3SiO_{1.5})_{c}(OCH(CH_3)_2)_{e}$—$(HSi(OCH_3)_2{}^O{}_{0.5})_{f}$; a=10, b=298, c=608, e=21, f=78, Mw=73,239

(B-5): $((CH_3)_3SiO_{0.5})_{a}(SiO_{2.0})_{d}(OCH_2CH_3)_{e}(HSi(OCH_3)_2O_{0.5})_{f}$; a=3,810, d=8,660, e=89, f=152, Mw=908,201

(B-6): $((CH_3)_3SiO_{0.5})_{a}((CH_3)_2SiO_{1.0})_{b}(SiO_{2.0})_{d}(OCH(CH_3)_2)_{e}$—$(HSi(OCH_3)_2O_{0.5})_{f}$; a=4,690, b=2,030, d=3960, e=54, f=305, Mw=848,410

(B-7): $((CH_3)_3SiO_{0.5})_{a}((CH_3)_2SiO_{1.0})_{b}(SiO_{2.0})_{d}(OCH(CH_3)_2)_{e}$—$(HSi(OCH_3)_2O_{0.5})_{f}$; a=1,505, b=1,520, d=3,010, e=188, f=80, Mw=436,079

(B-8): $((CH_3)_2SiO_{1.0})_{b1}((CH_3)HSiO_{1.0})_{b2}((C_6H_5)SiO_{1.5})_{c}$—$(HSi(OCH_2CH_3)_2O_{0.5})_{f}$; b1=21, b2=1, c=100, f=19, Mw=16,858

(B-9): $((C_6H_5)(CH_3)SiO_{1.0})_{b}((C_6H_5)SiO_{1.5})_{c}(OH)_{e}(HSi(OCH_3)_2O_{0.5})_{f}$; b=10, c=89, e=5, f=16, Mw=14,122

(B'-1): $(H(OEt)SiO)_{b}(HSi(OEt)_2O_{0.5})_{f}$; b=1, f=2, Mw=342

(B'-2): $(Me(OMe)SiO)_{b}(HSi(OMe)_2O_{0.5})_{f}$; b=4, f=2, Mw=582

(B'-3): $(Me_2SiO)_{b}(HSi(OMe)_2O_{0.5})_{f}$; b=120, f=2, Mw=9,102

Component (C)

Fluorescent substance: NYAG4454L (manufactured by intematix Corporation, D=12.8 μm)

Component (D)

(D-1): $((CH_3)_2SiO_{1.0})_{b'}(OH)_{e'}$; b'=1,000, e'=2, Mw=74,200

(D-2): $((C_6H_5)(CH_3)SiO_{1.0})_{b'}(OH)_{e'}$; b'=50, e'=2, Mw=7,002

Component (E)

Condensation Catalyst: Al Chelate D (Manufactured By Kawaken Fine Chemical Co., Ltd.)

Examples 1 to 10, Comparative Examples 1 to 5

The components (A), (B), (D), and (E) in each amount described in Table 1 and Table 2 were weighed out, and dissolved in xylene to prepare a xylene solution of organopolysiloxane composition (resin solution). The amount of the xylene was an amount to be 20 wt % with respect to the sum total of the components (A), (B), (D), and (E). The obtained resin solution was evaluated as follows.

[(1) Manufacture of Condensation-Curable Silicone Resin Composition Sheet]

Each of the foregoing resin solutions was poured into a Teflon (registered trade mark) mold of 10 cm×10 cm×0.1 μmt and was squeegeed to have a uniform thickness. Then the xylene was volatilized at 60° C. for 1 hour to manufacture a condensation-curable silicone resin composition sheet. The manufactured condensation-curable silicone resin composition sheet was took out from the mold, left on a horizontal mount at 25° C. for 8 hours, and observed whether the size had been changed or not. This was additionally left at 25° C. for 1 week to observe the size change. The sheet without changing the size for 1 week was determined to be a solid state, and the sheet with the size change being observed after 1 week without changing the size for 8 hours was determined to be a semi-solid state. The observational results were shown in Table 3 and Table 4.

[(2) Gel Ratio]

Each condensation-curable silicone resin composition sheet obtained in the foregoing (1) was cured at 150° C. for 2 hours to give a cured sheet. The obtained cured sheet in an amount of about 1 g was completely immersed to 20 g of acetone and left at 25° C. for 3 hours. Then, the acetone was removed by filtration, the cured sheet remained on the filter paper was dried sufficiently, and the weight was measured. The weight after immersing to acetone was divided by the weight before immersion, and this was determined to be a gel ratio. The results expressed in percent are described in Table 3 and Table 4.

6 hours. The cured material was placed in commercially available silver powder (average particle diameter: 5 μm). After this was took out, air was blown thereto to test whether the silver powder adhered like dust was come off or not. The cured material on which the silver powder was not remained was determined to be non-tacky. The results are described in Table 3 and Table 4.

TABLE 1

|       | Example 1 | Example 2 | Example 3 | Example 4 | Example 5 | Example 6 | Example 7 | Example 8 | Example 9 | Example 10 |
|-------|-----------|-----------|-----------|-----------|-----------|-----------|-----------|-----------|-----------|------------|
| (A-1) | 100       |           |           |           |           |           |           |           |           |            |
| (A-2) |           | 100       |           |           |           |           |           |           |           |            |
| (A-3) |           |           | 100       |           | 25        |           |           |           |           |            |
| (A-4) |           |           |           | 100       |           |           |           |           |           |            |
| (A-5) |           |           |           |           | 100       | 100       | 100       |           |           |            |
| (A-6) |           |           |           |           |           |           |           | 100       |           |            |
| (A-7) |           |           |           |           |           |           |           |           | 100       | 100        |
| (A'-1)|           |           |           |           |           |           |           |           |           |            |
| (B-1) |           |           |           | 75        |           |           |           | 100       |           |            |
| (B-2) |           |           |           |           | 10        |           |           |           |           |            |
| (B-3) | 80        |           |           |           |           |           |           |           |           |            |
| (B-4) |           |           |           |           |           |           |           | 25        |           |            |
| (B-5) |           |           | 100       |           |           |           |           |           |           |            |
| (B-6) |           | 75        |           |           |           |           |           |           |           |            |
| (B-7) |           |           |           |           |           |           | 50        |           |           |            |
| (B-8) |           |           |           |           |           |           |           |           | 75        |            |
| (B-9) |           |           |           |           |           |           |           |           |           | 75         |
| (B'-1)|           |           |           |           |           |           |           |           |           |            |
| (B'-2)|           |           |           |           |           |           |           |           |           |            |
| (B'-3)|           |           |           |           |           |           |           |           |           |            |
| (D-1) |           | 25        |           | 45        |           | 25        | 30        |           |           |            |
| (D-2) |           |           |           |           |           |           |           |           |           | 10         |
| (C)   |           |           |           |           |           |           |           |           |           |            |
| (E)   |           |           |           |           |           |           |           |           |           |            |

[(3) Hardness of Cured Material]

Each condensation-curable silicone resin composition sheet obtained in the foregoing (1) in an amount of about 2 g was folded and packed into a Teflon (registered trademark) mold of 2 cm×2 cm×3 mmt, and this was compression molded (1513° C., 5 minutes) with a compression molding machine. The obtained molding was cured at 150° C. for 6 hours. The obtained cured material was subjected to measurement of hardness (durometer Type A or Type D) in conformity with JIS K 6253-3: 2012. The results are described in Table 3 and Table 4.

[(4) Tensile Strength and Elongation at Break of Cured Material]

Each sample of the condensation-curable silicone resin composition sheet obtained in the foregoing (1) was subjected to measurement of tensile strength and elongation at break in conformity with JIS K 6251: 2010 by using a bench tester EZ TEST (apparatus name: EZ-L, manufactured by SHIMADZU CORPORATION) under the conditions of test speed: 500 mm/min, distance between two clamps: 80 mm, and distance between two gages: 40 mm. The results are described in Table 3 and Table 4.

[(5) Surface Tackiness]

Each condensation-curable silicone resin composition sheet obtained in the foregoing (1) was cured at 150° C. for

TABLE 2

|        | Comparative Example 1 | Comparative Example 2 | Comparative Example 3 | Comparative Example 4 | Comparative Example 5 |
|--------|-----------------------|-----------------------|-----------------------|-----------------------|-----------------------|
| (A-1)  |                       |                       |                       |                       |                       |
| (A-2)  |                       |                       |                       |                       |                       |
| (A-3)  |                       |                       |                       |                       |                       |
| (A-4)  |                       |                       |                       |                       |                       |
| (A-5)  |                       |                       | 100                   |                       |                       |
| (A-6)  |                       |                       |                       |                       |                       |
| (A-7)  |                       |                       |                       | 100                   | 100                   |
| (A'-1) | 100                   | 100                   |                       |                       |                       |
| (B-1)  |                       |                       |                       |                       |                       |
| (B-2)  |                       |                       |                       |                       |                       |
| (B-3)  |                       | 100                   |                       |                       |                       |
| (B-4)  |                       |                       |                       |                       |                       |
| (B-5)  |                       |                       |                       |                       |                       |
| (B-6)  |                       |                       |                       |                       |                       |
| (B-7)  |                       |                       |                       |                       |                       |
| (B-8)  |                       |                       |                       |                       |                       |
| (B-9)  |                       |                       |                       |                       |                       |
| (B'-1) | 50                    |                       |                       |                       |                       |
| (B'-2) | 50                    |                       | 100                   |                       |                       |
| (B'-3) |                       |                       |                       | 10                    |                       |
| (D-1)  |                       |                       | 50                    |                       |                       |
| (D-2)  |                       |                       |                       |                       | 10                    |
| (C)    |                       |                       |                       |                       |                       |
| (E)    |                       |                       |                       |                       | 1                     |

TABLE 3

|  | Example 1 | Example 2 | Example 3 | Example 4 | Example 5 | Example 6 | Example 7 | Example 8 | Example 9 | Example 10 |
|---|---|---|---|---|---|---|---|---|---|---|
| State (before curing) | Solid | Semi-solid | Solid | Solid | Solid | Solid | Solid | Solid | Solid | Solid |
| Gel ratio: % | 92 | 88 | 90 | 87 | 93 | 88 | 87 | 86 | 90 | 89 |
| Hardness: Type A | — | — | 84 | — | — | — | — | — | — | — |
| Hardness: Shore D | 20 | 42 | — | 15 | 35 | 46 | 50 | 52 | 35 | 28 |
| Tensile strength: MPa | 8.4 | 10.6 | 6.9 | 7.9 | 9.2 | 11.2 | 11.4 | 11.5 | 2.5 | 1.9 |
| Elongation: % | 50 | 30 | 80 | 60 | 50 | 30 | 30 | 20 | 160 | 180 |
| Silver powder adhesion test | Non-tacky | Non-tacky | Non-tacky | Non-tacky | Non-tacky | Non-tacky | Non tacky | Non-tacky | Non-tacky | Non-tacky |

TABLE 4

|  | Comparative Example 1 | Comparative Example 2 | Comparative Example 3 | Comparative Example 4 | Comparative Example 5 |
|---|---|---|---|---|---|
| State (before curing) | Semi-solid | Solid | Solid | Solid | Solid |
| Gel ratio: % | 62 | 65 | 52 | 41 | 83 |
| Hardness: Type A | 45 | 40 | 38 | 15 | — |
| Hardness: Shore D | — | — | — | — | 18 |
| Tensile strength: MPa | 4.2 | 4.5 | 3.1 | 0.6 | 1.7 |
| Elongation: % | 70 | 60 | 70 | 200 | 190 |
| Silver powder adhesion test | Tacky | Tacky | Tacky | Tacky | Non-tacky |

As shown in Table 3, using the inventive condensation-curable silicone resin composition sheet, Examples 1 to 10 each gave a cured material that showed sufficiently favorable hardness, elongation at break, and tensile strength without adhesion of silver powder due to surface tackiness, On the other hand, Comparative Examples 1 and 2, each of which used a condensation-curable silicone resin composition sheet that contained (A'-1) as the component (A), as well as Comparative Examples 3 and 4, each of which used a condensation-curable silicone resin composition sheet that contained (B'-2) or (B'-3) as the component (B), brought low gel ratio, insufficient hardness, and surface tackiness to cause silver powder adhesion as shown in Table 4. Comparative Example 5, using a condensation-curable silicone resin composition sheet that did not contain component (B), gave higher gel ratio and a favorable cured material, but this condensation-curable silicone resin composition sheet contained a condensation catalyst Examples 11 to 13, Comparative Example 6

The components (A), (B), (D), and (E) in each amount described in Table 5 were dissolved in xylene such that the total amount of the components was 20 wt %. To this resin solution, a fluorescent substance of component (C) was mixed in an amount described in Table 5.

[(6) Production of Wavelength Conversion Sheet]

As in the foregoing (1), the resin solution was poured into a Teflon (registered trade mark) mold of 10 cm×10 cm×0.1 μmt and was squeegeed to have a uniform thickness. Then the xylene was volatilized at 60° C. for 1 hour to produce a condensation-curable silicone resin composition sheet (wavelength conversion sheet containing a fluorescent substance).

[(7) Lightning Test]

An LED light emitting apparatus was produced by mounting an LED flip chip that emits 450 nm light (B4545FCM1, manufactured by Genelite Inc.) by soldering onto a gold electrode disposed on a ceramic substrate, laminating the wavelength conversion sheet obtained in the foregoing (6) by using a press vacuum laminator (V130 manufactured by Nikko-Materials Co., Ltd.) (laminate conditions: 80° C., time for drawing a vacuum: 60 seconds), and then curing the sheet at 150° C. for 6 hours. The produced LED light emitting apparatus was subjected to measurement of u'-v' chromaticity with LE-5400 (manufactured by Otsuka Electronics Co., Ltd.). Subsequently, the LED light emitting apparatus was lit up at 1,4 A in an oven at 150° C., and the u'-v' chromaticity after 1,000 hours was measured. Each difference of chromaticity after lighting for 1,000 hours from the initial chromaticity, which was set to 0, is described in Table 6. Table 6 also describes each difference of chromaticity after performing 1,000 times of thermal cycle test (TCT) between -40° C. and 125° C. while lightening at 1.4 A. Incidentally, larger difference value of chromaticity (color drift) means larger coloring, cracks in a resin, and delamination from a substrate, each of which is due to degradation of the wavelength conversion sheet.

TABLE 5

|  | Example 11 | Example 12 | Example 13 | Comparative Example 6 |
|---|---|---|---|---|
| (A-1) | 100 | | | |
| (A-2) | | 100 | | |
| (A-3) | | | | |
| (A-4) | | | | |
| (A-5) | | | | |
| (A-6) | | | | |
| (A-7) | | | 100 | 100 |
| (A'-1) | | | | |
| (B-1) | | | | |
| (B-2) | | | | |
| (B-3) | 80 | | | |

TABLE 5-continued

|  | Example 11 | Example 12 | Example 13 | Comparative Example 6 |
|---|---|---|---|---|
| (B-4) |  |  |  |  |
| (B-5) |  |  |  |  |
| (B-6) |  | 75 |  |  |
| (B-7) |  |  |  |  |
| (B-8) |  |  |  |  |
| (B-9) |  |  | 75 |  |
| (B'-1) |  |  |  |  |
| (B'-2) |  |  |  |  |
| (B'-3) |  |  |  |  |
| (D-1) |  | 25 |  |  |
| (D-2) |  |  | 10 | 10 |
| (C) | 100 | 100 | 100 | 100 |
| (E) |  |  |  | 1 |

TABLE 6

|  | Example 11 | Example 12 | Example 13 | Comparative Example 6 |
|---|---|---|---|---|
| Color drift u'-v' after lighting test at 150° C., 1.4 A for 1000 hours | 0.0014 | 0.0011 | 0.0024 | 0.0321 |
| Color drift u'-v' after 1000 cycles of 1.4 A, −40° C. ↔ 125° C. | 0.0019 | 0.0016 | 0.0028 | 0.058 |

As shown in Table 6, Examples 11 to 13, each of which used the inventive condensation-curable silicone resin composition sheet, brought smaller color drift as well as excellent heat resistance and light resistance. On the other hand, Comparative Example 6, which used a condensation-curable silicone resin composition sheet without containing a component (B), showed larger color drift as well as inferior heat resistance and light resistance.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method of manufacturing a condensation-curable silicone resin composition sheet, the method comprising
   diluting an organopolysiloxane composition to constitute the condensation-curable silicone resin composition sheet with an organic solvent, wherein the organopolysiloxane composition comprises:
   a component (B) in an amount of 5 to 100 part by mass based on 100 parts by mass of a component (A),
   where
   the component (A) is a organopolysiloxane having a weight average molecular weight of 5,000 or more and 1,000,000 or less in terms of polystyrene and being in a plastic solid state or a semi-solid state at ordinary temperature, with the molecule having at least two silicon atom-bonded alkoxy groups or silicon atom-bonded hydroxy groups, shown by the following formula (1):

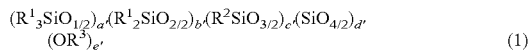

wherein
   each $R^1$ independently represents a hydrogen atom, a monovalent aliphatic hydrocarbon group having 1 to 6 carbon atoms, or an aromatic hydrocarbon group having to 12 carbon atoms,
   $R^2$ represents a monovalent aliphatic hydrocarbon group having 1 to 6 carbon atoms or an aromatic hydrocarbon group having 6 to 12 carbon atoms,
   $R^3$ represents a hydrogen atom, an alkyl group having 1 to 6 carbon atoms, or an alkoxyalkyl group having 2 to 6 carbon atoms,
   each of "a'", "b'", "c'", and "d'" is an integer of 0 or more,
   "e'" is an integer of 2 or more, and
   b'+c'+d' is an integer of 1 or more, and
   the component (B) is an organopolysiloxane having a molecular weight of 10,000 or more and 1,000,000 or less in terms of polystyrene, with the molecule having at least two silicon atoms, each of which has one hydrogen atom and two alkoxy groups or hydroxy groups, shown by the following formula (2):

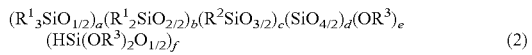

wherein
   $R^1$, $R^2$ and $R^3$ have the same meanings as described above,
   each of "a", "b", "c", "d", and "e" is an integer of 0 or more, c+d is an integer of 2 or more, and
   "f" is an integer of 2 or more;
   applying the organopolysiloxane composition diluted with the organic solvent onto a substrate sheet to form a coated film, and
   drying the formed coated film at 25 to 180° C. to manufacture the condensation-curable silicone resin composition sheet, wherein the condensation-curable silicone resin composition sheet is in a plastic solid state or a semi-solid state at ordinary temperature.

2. The method according to claim 1, wherein the organopolysiloxane composition further comprises a fluorescent substance as a component (C).

3. The method according to claim 2, wherein the content of the component (C) is 0.1 to 1,000 parts by mass with respect to 100 parts by mass of a sum total of the component (A) and the component (13).

4. The method according to claim 2, wherein the component (C) has an average particle diameter of 1 to 50 μm.

5. The method according to claim 3, wherein the component (C) has an average particle diameter of 1 to 50 μm.

6. A method of manufacturing a light-emitting apparatus having a covered LED device, comprising:
   disposing a condensation-curable silicone resin composition sheet on a surface of an LED device,
   curing the condensation-curable silicone resin composition sheet by heating to form a silicone resin layer, and
   covering the surface of the LED device with the formed silicone resin layer; wherein the condensation-curable silicone resin composition sheet comprises
   organopolysiloxane having a weight average molecular weight of 5,000 or more and 1,000,000 or less in terms of polystyrene and being in a plastic solid state or a semi-solid state at ordinary temperature, with the molecule having at least two silicon atom-bonded alkoxy groups or silicon atom-bonded hydroxy groups, shown by the following formula (1):

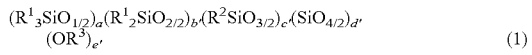

wherein
   each $R^1$ independently represents a hydrogen atom, a monovalent aliphatic hydrocarbon group having 1 to 6 carbon atoms, or an aromatic hydrocarbon group having 6 to 12 carbon atoms;

$R^2$ represents a monovalent aliphatic hydrocarbon group having 1 to 6 carbon atoms or an aromatic hydrocarbon group having 6 to 12 carbon atoms;

$R^3$ represents a hydrogen atom, an alkyl group having 1 to 6 carbon atoms, or an alkoxyalkyl group having 2 to 6 carbon atoms;

each of "a'", "b'", "c'", and "d'" is an integer of 0 or more;

"e'" is an integer of 2 or more; and b'+c'+d' is an integer of 1 or more; and (B) organopolysiloxane having a molecular weight of 10,000 or more and 1,000,000 or less in terms of polystyrene, with the molecule having at least two silicon atoms, each of which has one hydrogen atom and two alkoxy groups or hydroxy groups, shown by the following formula (2)

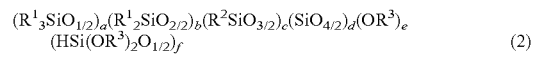

(2)

wherein $R^1$, $R^2$ and $R^3$ have the same meanings as described above;

each of "a", "b", "c", "d", and "e" is an integer of 0 or more;

c+d is an integer of 2 or more; and

"f" is an integer of 2 or more;

wherein the condensation-curable silicone resin composition sheet is in a plastic solid state or a semi-solid state at ordinary temperature and comprises the component (B) in an amount of 5 to 100 parts by mass based on 100 parts by mass of the component (A).

7. The method according to claim 6, wherein the condensation-curable silicone resin composition sheet further comprises a fluorescent substance as a component (C).

8. The method according to claim 7, wherein the content of the component (C) is 0.1 to 1,000 parts by mass with respect to 100 parts-by mass of a sum total of the component (A) and the component (B).

9. The method according to claim 7, wherein the component (C) has an average particle diameter of 1 to 50 μm.

10. The method according to claim 8, wherein the component (C) has an average particle diameter of 1 to 50 μm.

* * * * *